(12) United States Patent
Olson

(10) Patent No.: US 8,387,234 B2
(45) Date of Patent: Mar. 5, 2013

(54) MULTI-TURN COIL DEVICE

(75) Inventor: Bruce D. Olson, Northfield, MN (US)

(73) Assignee: Flextronics AP, LLC, Broomfield, CO (US)

( * ) Notice: Subject to any disclaimer, the term of this patent is extended or adjusted under 35 U.S.C. 154(b) by 215 days.

(21) Appl. No.: 12/940,701

(22) Filed: Nov. 5, 2010

(65) Prior Publication Data

US 2011/0050381 A1 Mar. 3, 2011

Related U.S. Application Data

(62) Division of application No. 12/079,777, filed on Mar. 28, 2008, now Pat. No. 8,191,241.

(60) Provisional application No. 60/921,220, filed on Mar. 29, 2007.

(51) Int. Cl.
*B23P 19/00* (2006.01)
*H01R 43/00* (2006.01)
*H05K 13/04* (2006.01)

(52) U.S. Cl. ........... 29/729; 29/603.23; 29/606; 29/831; 29/837; 336/65; 336/83; 336/200; 336/206; 336/208

(58) Field of Classification Search ................. 29/592.1, 29/602.1, 603.23, 606, 831, 832, 837; 336/65, 336/83, 90–96, 200, 206–208, 323
See application file for complete search history.

(56) References Cited

U.S. PATENT DOCUMENTS

| | | | |
|---|---|---|---|
| 2,911,605 A | 11/1959 | Wales, Jr. | |
| 4,051,425 A | 9/1977 | Smith | |
| 4,495,546 A | 1/1985 | Nakamura et al. | |
| 4,712,160 A | 12/1987 | Sato et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |
| 4,975,821 A | 12/1990 | Lethellier | |
| 5,101,322 A | 3/1992 | Ghaem et al. | |
| 5,164,657 A | 11/1992 | Gulczynski | |
| 5,235,491 A | 8/1993 | Weiss | |
| 5,262,932 A | 11/1993 | Stanley et al. | |
| 5,295,044 A | 3/1994 | Araki et al. | |
| 5,490,052 A | 2/1996 | Yoshida et al. | |
| 5,565,761 A | 10/1996 | Hwang | |
| 5,565,781 A | 10/1996 | Dauge | |
| 5,592,128 A | 1/1997 | Hwang | |
| 5,712,772 A | 1/1998 | Telefus et al. | |
| 5,742,151 A | 4/1998 | Hwang | |
| 5,747,977 A | 5/1998 | Hwang | |
| 5,798,635 A | 8/1998 | Hwang et al. | |
| 5,804,950 A | 9/1998 | Hwang et al. | |

(Continued)

FOREIGN PATENT DOCUMENTS

WO   WO 02/39467 A1   5/2002
WO   WO2005122377 A1  12/2005

OTHER PUBLICATIONS

Notice of Allowance, U.S. Appl. No. 12/079,777, filed Mar. 28, 2008, applicant: Bruce D. Olsen, 7 pages.

(Continued)

*Primary Examiner* — Paul D Kim
(74) *Attorney, Agent, or Firm* — Haverstock & Owens LLP

(57) ABSTRACT

A multi-turn coil device comprising a flexible circuit board and a plurality of serially electrically coupled coils coupled to both sides of the flexible circuit board. The coils are formed such that when the circuit board is folded in an accordion manner, the coils are substantially aligned and have the same direction of current flow. The coils are serially coupled sequentially from front to back and back to front wherein the coupling of the coils is through a plated through hole in the flexible circuit board.

12 Claims, 6 Drawing Sheets

U.S. PATENT DOCUMENTS

| | | | |
|---|---|---|---|
| 5,811,895 | A | 9/1998 | Suzuki et al. |
| 5,818,207 | A | 10/1998 | Hwang |
| 5,870,294 | A | 2/1999 | Cyr |
| 5,894,243 | A | 4/1999 | Hwang |
| 5,903,138 | A | 5/1999 | Hwang et al. |
| 5,905,369 | A | 5/1999 | Ishii et al. |
| 5,923,543 | A | 7/1999 | Choi |
| 6,039,600 | A | 3/2000 | Etters et al. |
| 6,058,026 | A | 5/2000 | Rozman |
| 6,069,803 | A | 5/2000 | Cross |
| 6,077,124 | A | 6/2000 | Etters et al. |
| 6,160,725 | A | 12/2000 | Jansen |
| 6,272,015 | B1 | 8/2001 | Mangtani |
| 6,282,092 | B1 | 8/2001 | Okamoto et al. |
| 6,344,980 | B1 | 2/2002 | Hwang et al. |
| 6,358,064 | B2 | 3/2002 | Szalay et al. |
| 6,396,277 | B1 | 5/2002 | Fong et al. |
| 6,407,514 | B1 | 6/2002 | Glaser et al. |
| 6,469,914 | B1 | 10/2002 | Hwang et al. |
| 6,469,980 | B1 | 10/2002 | Takemura et al. |
| 6,483,281 | B2 | 11/2002 | Hwang |
| 6,531,854 | B2 | 3/2003 | Hwang |
| 6,541,944 | B2 | 4/2003 | Hwang |
| 6,578,253 | B1 | 6/2003 | Herbert |
| 6,605,930 | B2 | 8/2003 | Hwang |
| 6,657,417 | B1 | 12/2003 | Hwang |
| 6,671,189 | B2 | 12/2003 | Jansen et al. |
| 6,674,272 | B2 | 1/2004 | Hwang |
| 6,958,920 | B2 | 10/2005 | Mednik et al. |
| 7,047,059 | B2 | 5/2006 | Avrin et al. |
| 7,286,376 | B2 | 10/2007 | Yang |
| 7,439,962 | B2 | 10/2008 | Reynolds et al. |
| 2002/0011823 | A1 | 1/2002 | Lee |
| 2003/0035303 | A1 | 2/2003 | Balakrishnan et al. |
| 2004/0228153 | A1 | 11/2004 | Cao et al. |
| 2005/0105224 | A1 | 5/2005 | Nishi |
| 2005/0281425 | A1 | 12/2005 | Greuet et al. |
| 2008/0238600 | A1 | 10/2008 | Olson |

OTHER PUBLICATIONS

Final office action mailed Oct. 11, 2011, U.S. Appl. No. 12/079,777, filed Mar. 28, 2008, 8 pages.

First Chinese office action, application No. 200880010440.8, entitled "Method of Producing a Multi-Turn Coil from Folded Flexible Circuitry", 15 pages.

Office action dated Oct. 18, 2010, U.S. Appl. No. 12/079,777, filed Mar. 28, 2008, 5 pages.

Office action dated Jan. 14, 2011, U.S. Appl. No. 12/079,777, filed Mar. 28, 2008, 6 pages.

E.E. Times.com—"Team Claims Midrange Wireless Energy Transfer", by R. Colin Johnson, 4 pages, Nov. 6, 2007.

EE Times.com—"Wireless Beacon Could Recharge Consumer Devices", by R. Colin Johnson, 3 pages, Nov. 6, 2007.

"New Architectures for Radio Frequency dc/dc Power Conversion", Juan Rivas et al., Laboratory for Electromagnetic and Electronic Systems, Massachusetts Institute of Technology, Room 10-171 Cambridge, MA 02139, pp. 4074-4084.

Scollo, P. Fichera R., "Electronic Transformer for a 12V Halogen La", 1999 ST Microelectronics pp. 1-4.

Hang-Seok Choi et al., Novel Zero-Voltage and Zero-Current-Switching (ZVZCS) Full-Bridge PWM Converter Using Coupled Output Inductor, Sep. 2002 IEEE, 4 pages.

MULTI-TURN COIL DEVICE

RELATED APPLICATIONS

This patent application is a divisional application of U.S. patent application Ser. No. 12/079,777, filed on Mar. 28, 2008, now U.S. Pat. No. 8,191,241, and entitled "METHOD OF PRODUCING A MULTI-TURN COIL FROM FOLDED FLEXIBLE CIRCUITRY," which claims priority under 35 U.S.C. 119(e) of the U.S. Provisional Pat. App. No. 60/921,220, filed Mar. 29, 2007, entitled "PRIMARY ONLY CONSTANT VOLTAGE/CONSTANT CURRENT (CVCC) CONTROL IN QUASI RESONANT CONVERTOR," which is hereby incorporated by reference.

FIELD OF THE INVENTION

The invention relates to a device for and method of manufacturing multi-turn coils. More specifically, the invention relates to the use of folded flexible circuitry to form a multi-turn coil.

BACKGROUND OF THE INVENTION

There has long existed a need for multi-turn coils. Such multi-turn coils are used as electronic components in sensors, actuators, antennas, transformers, and in motors or alternators. The current state-of-the-art for manufacturing multi-turn coils is to form a coil trace on a circuit board. Typically, the coil consists of a spiral of conductive material that is printed, etched, or otherwise formed on a circuit board. A two-layer coil can be formed by forming a coil on one side of the board that is coupled to a coil on the opposing side of the circuit board. What is needed is a low-cost multi-turn coil that is simple and a cost-effective method to manufacture a coil with more than two layers and a larger number of coil turns.

SUMMARY OF THE INVENTION

In the first aspect of the invention, a multi-turn coil device is disclosed. The device includes a flexible circuit board and a plurality of coils coupled to the circuit board. The coils are coupled together serially and each coil has either clockwise or counter clockwise current flow direction. Further, the coils have either an inward spiral or outward spiral orientation. The coils are formed on the circuit board such that when the flexible circuit board is folded, the coils substantially overlap each other and form a multi-turn coil. Preferably, the coils are formed such that when the flexible circuit board is folded along folding lines, the overlapping coils have the substantially the same current flow direction.

The coils can be coupled, formed, or attached on one side or both sides of the flexible circuit board. Preferably, there are coils on both sides of the flexible circuit board and there are equal number of coils on each side of the circuit board. Further, the coils on opposing sides of the board are preferably substantially aligned. The coils can be coupled together in any serial order. However, it is preferable that front and back opposing coils are sequentially and serially coupled together. This provides a topology where the connections between coils do not have to cross any coil loops. The front side loop spirals towards the center and passes through the circuit board where it couples to the back-side coil. The back-side coil spirals away from the center terminating at the outside edge where it can be coupled with the adjacent back side coil. This layout of the coils eliminates the need for the coil paths to cross a coil trace or connector between the coil traces. The preferred sequence of serially coupling the coils is the repeating sequence front to back and the back to front. The coupling of the coils on opposing sides of the board is preferably a conductive path through the circuit board but other conductive paths are contemplated. The conductive path can be a connector or preferably a plated through hole. The flexible circuit board can be a single layer board or alternatively a multilayer board can be used.

Before the flexible circuit board is folded and the coils aligned, insulation should be placed over the coils that are immediately adjacent to other coils after folding and thus prevent the coils from shorting. The insulation can be a coating applied to the coils. Alternatively, the insulation can be a membrane or a number of membranes coupled to the coils that will come into contact with another coil upon folding.

In another embodiment of the invention, the flexible circuit board includes means for aligning the coils when folding the circuit board. The alignment mean is preferably a folding line but other alignment means are contemplated. These means can include but are not limited to alignment holes, markings on the circuit board, and patterns formed in the flexible circuit board. The folding lines are preferably scoring lines on the flexible circuit board but can include other means such but not limited to perforations, cuts, and indentations. The folding line should not cut or damages any conductive traces that transect the folding line. The scoring lines can be formed on the circuit board, on the insulation that is coupled to the circuit board, or both.

Different folding patterns can be used to form a multi-turn coil. Preferably an accordion pattern is used but other folding patterns are contemplated by this invention. A fold over pattern can be used. This folding pattern is formed by folding the flexible circuit board in half and then again folding the circuit board in-half. Alternatively a double fold can be use to fold the circuit board. In this pattern, the flexible circuit board ends are folded to the middle. Next, this folded structure is folded in-half. Also, considered is a roll over folding pattern. This folding pattern is formed by folding the first coil or opposing coil pair onto the adjacent coil or coil pair. The folded structure is repeatedly folded onto the adjacent coil or coil pair until all of the coils are formed into in a multi-layer stack forming a multi-turn coil.

In a second aspect of the invention, a method of manufacturing a multi-turn coil device is disclosed. In one step a flexible circuit board is formed. The circuit board can be any non-conductive flexible material, preferably a polymer material, where the circuit board is cut from a larger sheet of polymer material. Alternatively a flexible non-conductive material could be poured into a mold or rolled out to provide the desired flexible circuit board shape.

In another step multiple coils are formed and coupled to the flexible circuit board. The coils can be formed by the method of but not limited to etching, electroplating, or adhesively coupling preformed coils to the flexible circuit board. Alternatively, the coils can be formed by printing with electrically conductive ink. Preferably, the coils are positioned to substantially overlap when the flexible circuit board is folded. Further, the circuit flow direction of each coil, either substantially clockwise or counterclockwise, is preferably all in the same direction.

As part of the manufacturing of the multi-turn coil, an alignment means can be formed on, coupled to, or attached to the board. The alignment means includes but are not limited to a hole through which a mechanical device provides alignment, forming circuit board structures that interlocks to provide alignment, applying marks to help an external alignment mechanism, or preferably forming a folding line. A folding line can be formed by perforations, cutting, marking, or preferably scoring. The folding line should not interfere with any conductors that transect the folding line. Such interference includes cutting, damaging, or substantially increasing the resistance of the conductors transecting the folding line.

For a multi-turn coil, with coils on both sides of the flexible circuit board, a means is needed to serially couple the coils on the front side of the flexible circuit board and the back side of the flexible circuit board. Preferable, the coupling is through an electrically conductive path through the board. One method for such a coupling is with plated through holes however other methods are contemplated. These can include but are not limited to a connector or wires.

Before folding the flexible circuit board with the coupled coils, insulation needs to be applied to the coils that will come into contact with another coil upon folding and thus short. This insulation can be a coating formed onto the coils. Alternatively, the insulation can be an insulating membrane that is coupled to the coils or other conductors requiring that will come into contact upon folding. Single or multiple pieces of insulation can be used. The placement of the insulation will depend on the folding pattern used.

In one embodiment, the preferred method for folding is an accordion pattern. However, other folding patterns are contemplated. These folding patterns include but are not limited to a fold-over pattern, a double-fold pattern, or a rolling-fold pattern.

BRIEF DESCRIPTION OF THE DRAWINGS

The invention is better understood by reading the following detailed description of exemplary embodiments in conjunction with the accompanying drawings.

DETAILED DESCRIPTION OF THE INVENTION

The following description of the invention is provided as an enabling teaching of the invention in its best, currently known embodiment. Persons skilled in the relevant art will recognize that many changes can be made to the embodiment described, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptions to the present inventions are possible and may even be desirable in certain circumstances, and are a part of the present invention. Thus, the following description is provided as illustrative of the principles of the present invention and not in limitation thereof, since the scope of the present invention is defined by the claims.

Figure 1A:
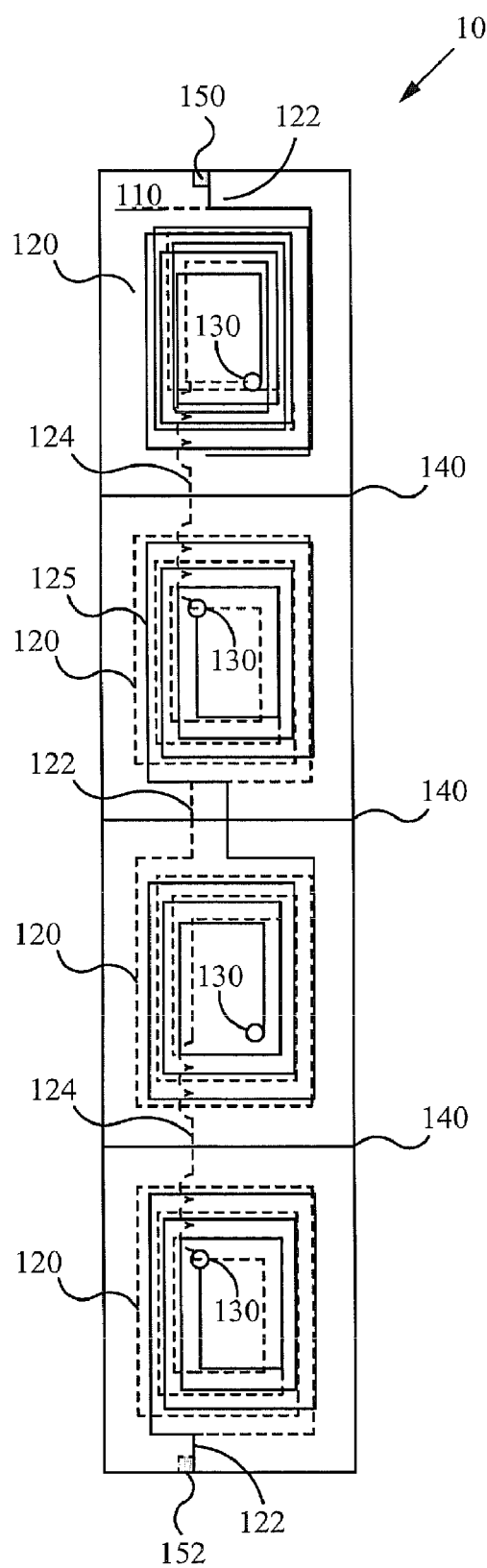
FIG. 1A is a top view illustration of a flexible circuit broad with coils serially connected on both sides of the circuit board connect from one side to the opposing side through a plated through hole.

FIG. 1A illustrates an unfolded multi-turn coil 100 formed from a flexible circuit board 110 with a series of inwardly spiraling coils 120 and outwardly spiral coils 125. Once folded, the multi-turn coil 100 can be used as part of a sensor (not shown).

In the shown embodiment, a number of inwardly spiraling coils 120 and outwardly spiraling coils 125 are shown on the front and back side of the flexible circuit board 110. The coils 120 and 125 on the back side of the circuit board 110 are shown with dashed lines. The coils 120 and 125 are connected serially. The connection between a coil 120 on the front of the board 110 and the opposing coil 125 on the back of the circuit board 110 is provided by a plated through hole 130. However, other methods of providing connectivity are contemplated including but not limited to direct soldering, connectors, and wires.

To produce a device that is sensitive to magnetic flux, the flow direction of the circuit path of the coils 120 and 125 need to be in the substantially same direction when folded. The flow direction refers to either a clockwise or counter clockwise current flow in the coils 120 and 125. Thus, the current flow direction of the coils 120 on the front of the circuit board 110 and the opposing coils 125 back of the circuit board 110 must be formed and coupled to maintain a substantially similar current flow direction in relation to a magnetic field passing through the center of the coils 120 and 125.

Following the circuit path shown in FIG. 1A, the circuit starts from the contact point 150 and is coupled with the coil 120 on the front side of the flexible circuit board through the conduction path 122. The coil 120 and circuit path follows a substantially clockwise direction which terminates at the plated through hole 130. The plated through hole 130 is located inside of the coil path. The circuit path continues through the flexible circuit board 110 to the back side of the board 110 by the way of a plated through hole 130. On the back side of the board, the plated through hole 130 is coupled to the coil 125. The flow path for the coil 125, on the back side of the circuit board 110, follows in a substantially clockwise outward spiral direction, as viewed from the top side of the circuit board 110. The back-side coil 125 terminates on the outside edge of the coil 125 where it is then coupled by a conductor 124 to the adjacent coil 120.

The coils 120 and 125 are preferably coupled in the repeating pattern of front to back and then back to front. This coupling arrangement has the advantage of being able to couple to the adjacent coil without having to cross a coil conductor. As shown, the back-side coil 125 spirals outwards in a clockwise direction, as viewed from the top, to the conductor 124 which connects the adjacent coil 120 on the backside of the circuit board 110.

Preferably, the flexible circuit board 110 is designed to fold in an accordion manner. The pairs of coils 120 and 125 in adjacent folding sections are formed in a mirror image of the adjacent coils 120 and 125. Further, the coils are formed or placed on the flexible circuit board 110 such that when the flexible circuit board 110 is folded in an accordion manner, the adjacent coils 120 and 125 are substantially aligned and each coil 120 and 125 has the same current flow direction.

The circuit path ends at the connection point 152. The connection point 152 is shown on the top side of the flexible circuit board 110 but other locations are contemplated. A plated through hole (not shown) could be added and the contact 152 positioned formed on the opposing side of the flexible circuit board 110. The contact point 152 could be run to any place on the board 110 that does not interfere with the operation of the coils 120 and 125. Preferably the contact points 150 and 152 are configured for a solder joint. Other circuit coupling means are contemplated such as but not limited to eutectic bonds, or a connector.

Alignment of the coils 120 and 125 is assisted by the forming of folding lines 140. Preferably the folding lines 140 are a series of scores in the flexible circuit board 110 or alternatively in an insulation layer, or both. Preferably, the scoring does not damage or increase the resistance of the electrical conductors 122 and 124 between adjacent pairs of coils 120 and 125 or any other conductors that transect the folding line 140. Further, the folding lines 140 are positioned so that the pairs of coils 120 and 125 are aligned once folded in an accordion pattern. Other means to create a folding line 140 are also contemplated. These means include but are not limited to the flexible circuit board 110 being perforated or partially cut.

For illustrative purposes, the coils 120 and 125 on the back side of the board 110 are shown slightly offset. Preferably, the coil 120 on the top side and the bottom side are substantially aligned. Alignment increases the sensitivity to a magnetic flux passing through the center of the coils 120 and 125.

Figure 1B:
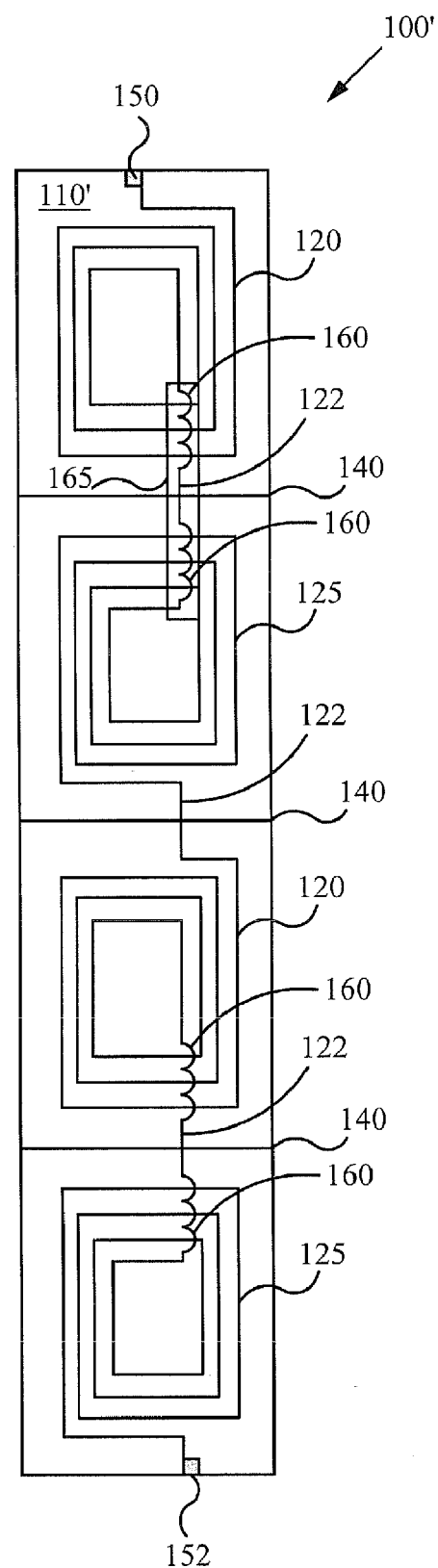
FIG. 1B is a top view illustration of a flexible circuit broad with coils serially connected on a single side.

FIG. 1B illustrates an alternative embodiment of an unfolded multi-turn coil 100' formed from a flexible circuit board 110' with a series of coils 120 and 125 on a single side of the circuit board 110'. A one-sided multi-turn coil 100' can provide the advantage that of being easier to manufacture. Like the coils 120 in FIG. 1A, adjacent coils are formed in a mirror image of each other so that when the circuit board is folded in an accordion pattern, each coil has the same circuit flow direction. Further, the coils 120 and 125 are serially couple with connectors 122 and 124 so that the each coil 120 and 125 has the same flow direction when the circuit board 110' is folded. The coupling of the coils can require a bridging component 160 to cross from the inside of the coil 120 to the outside of the coil 125. The bridging component 160 should not cause any electrical shorts across the coils 120 and 125. A short would greatly reduce the sensitivity of the coils 120 and 125 to a magnetic flux. The bridging component 160 can be an electrically conductive wire or trace with insulation 165 configured to prevent shorting to the coil. Alternatively, the bridging component could be a trace (not shown) on the backside of the board 110' or a trace with in a multi-layer flexible circuit board, coupled to the coils 120 and 125 by a through hold (not shown).

The folding lines 140 and the connection points 150 and 152 are as described for the corresponding items in FIG. 1A. The connection points 150 and 152 can be positioned on either side of the circuit board 110' or at any point on the board that does not interfere with the operation of the coils 120 and 125.

Figure 1C:
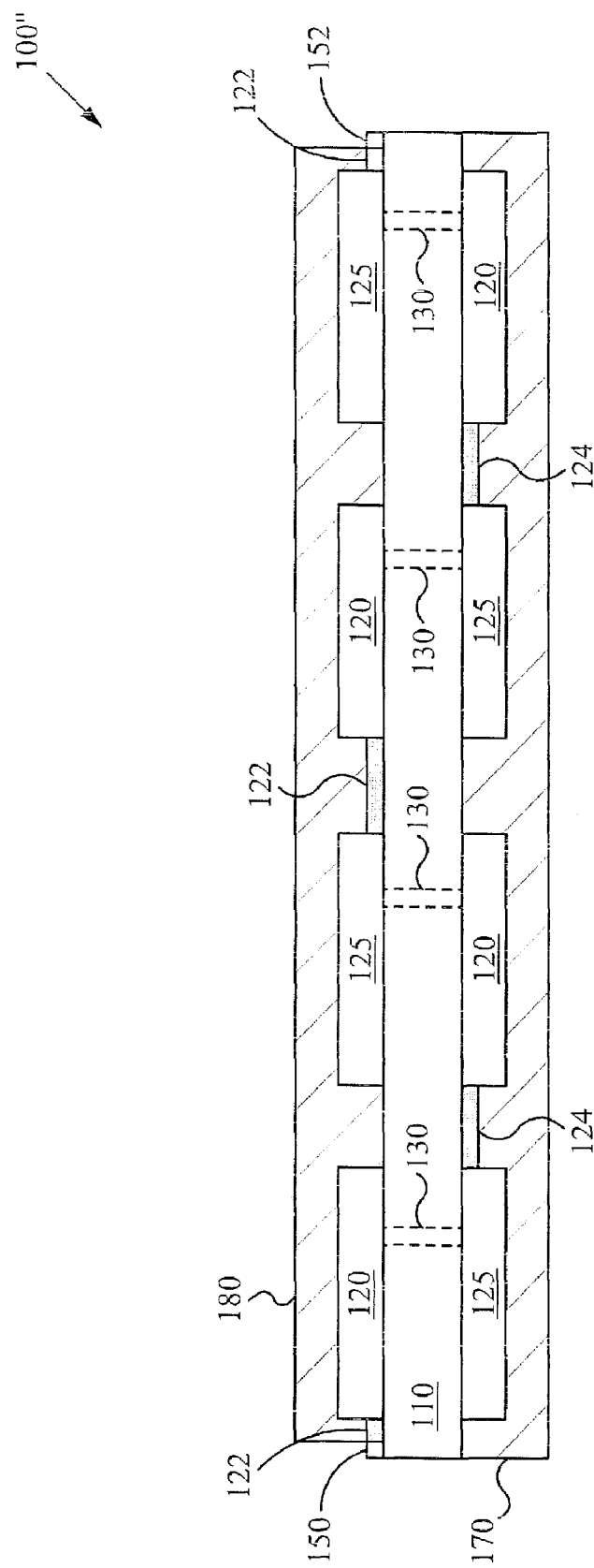
FIG. 1C illustrates a side view of a flexible circuit board with serially connected coils on both sides of the board with an insulation coating on the top and bottom of the board.

FIG. 1C illustrates a side view of the unfolded multi-turn coil 100" with coils 120 and 125 on both sides of the flexible circuit board 110. Additionally, an insulation layer 170 and 180 is shown on the top and bottom of the circuit board 110. The insulation layer 170 and 180 prevents the coils 120 and 125, and the connectors 122 and 124 from shorting when folding the flexible circuit board 110. The insulation layer 170 and 180 is shown as a coating on the top and bottom of the board. However, other means for providing insulation is contemplated. These means include but are not limited to a single membrane (not shown) covering both sides of the unfolded multi-turn coil 100, or individual membranes (not shown) covering a sufficient area of coils 120 and 125 to prevent shorting. An adhesive or mechanical device (not show) can be used to hold the device 100" in a folded and aligned configuration.

Figure 2:
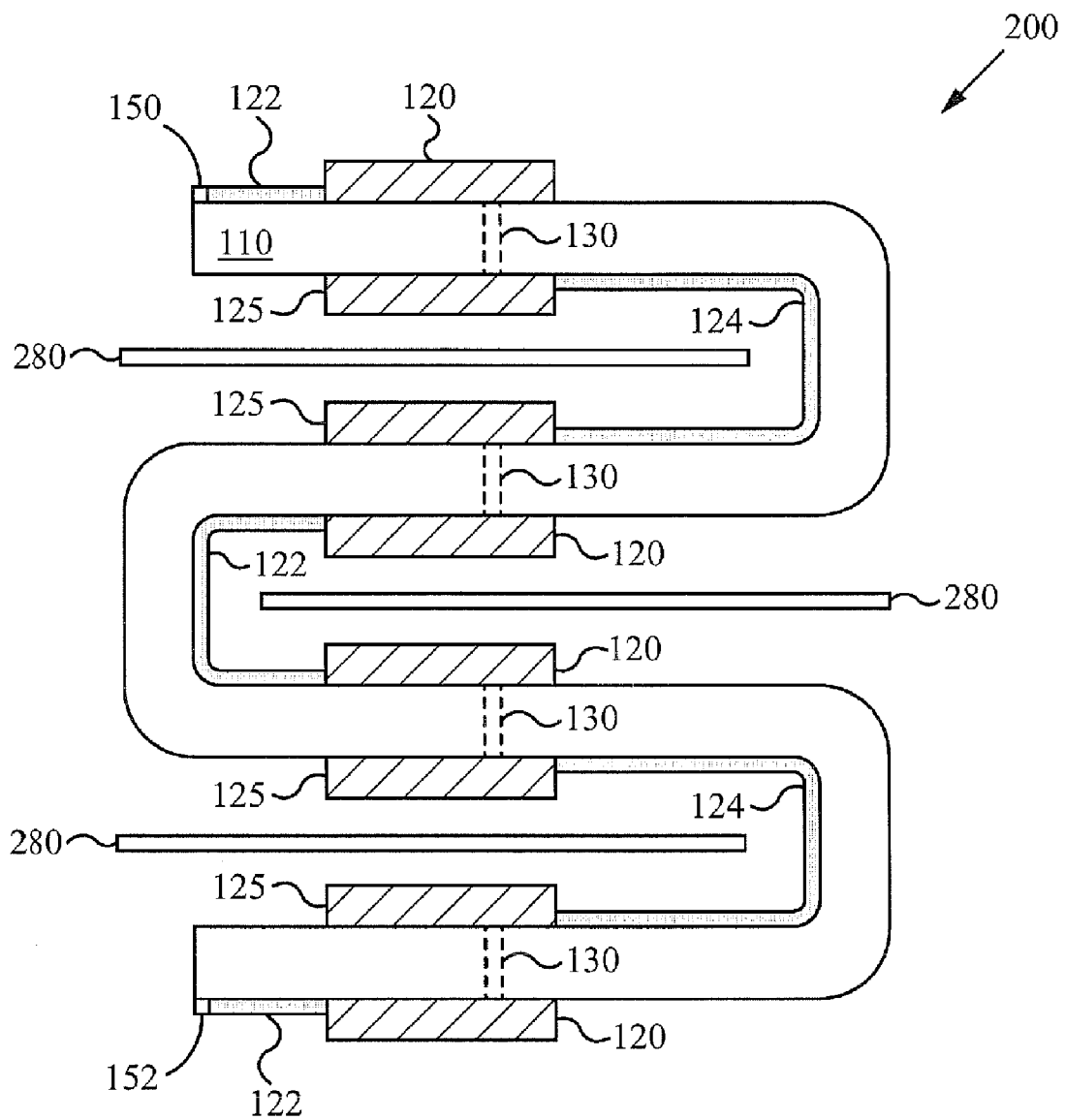
FIG. 2 illustrates the multi-turn coil where the flexible circuit board is partially folded in an accordion manner and with an insulation membranes.

FIG. 2 illustrates an accordion folded two sided multi-turn coil 200. The device structure is as described for 100-FIG. 1A with the addition of the insulation membranes 280 to prevent the coils 120 and 125 on adjacent folds from shorting together. Preferably, the membranes 280 are as thin as possible. As illustrated, the multi-turn coil 200 is not fully configured. In a final configuration the multi-turn coil 200 does not have a gap between the insulator 280 and the coils 120 and 125. There can be some coupling material, such as an adhesive, between the coil 120 and 125 and the insulators to hold the device 200 in a folded and aligned configuration. Alternatively, a mechanical device can be used to hold the device 200 in the folded configuration.

Figure 3:
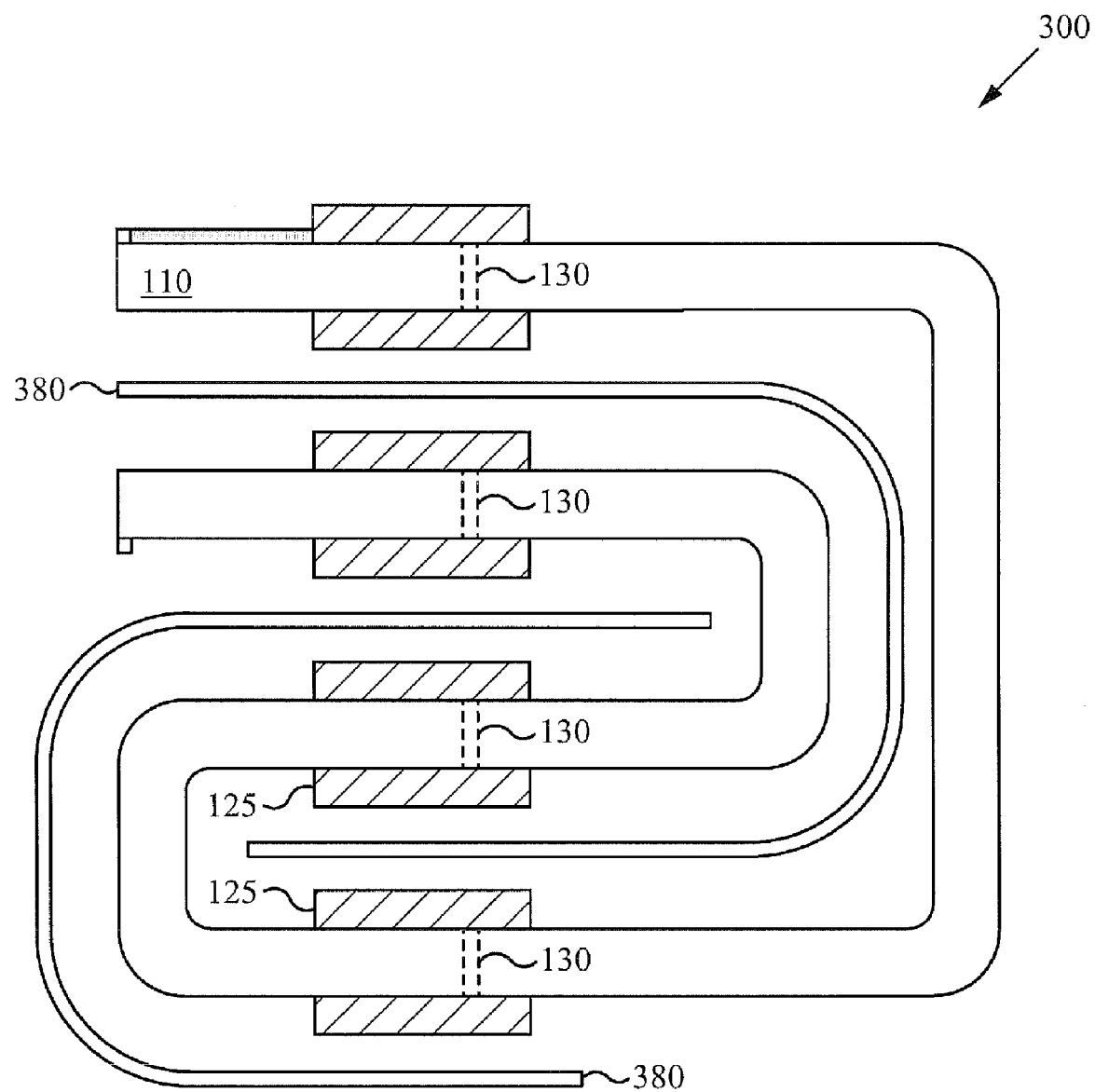
FIG. 3 illustrates a multi-turn coil where the flexible circuit board and insulation membranes, folded with an fold over pattern.

FIG. 3 illustrates an alternative method for forming a multi-turn coil 300. As illustrated a fold over technique is used to form the multi-turn coil 300. In the fold-over technique, the unfolded multi-turn assembly 100-FIG. 1 is folded in half, and then folded in half again and again until all the coils substantially overlap. The device structure is as described for 100-FIG. 1A with the addition of the insulation membranes 380 and 382 to prevent the coils 120 and 125 on adjacent layers from shorting together. The resulting multi-turn coil 300 preferably has the circuit flow direction of the coils 120 and 125 orientated in the same direction.

While two folding techniques are illustrated in FIG. 2 and FIG. 3, other folding techniques are contemplated. These include a double fold where the ends are folded into the middle and then folded in half. This pattern is repeated until all the coils substantially overlap. Also, roll folding is contemplated where the flexible circuit 110-FIG. 1 along with an insulation membrane 380-FIG. 3 is repetitively folded over on itself. To form a multi-turn coil with the coil orientations having the same flow direction, these folding techniques can require a different arrangement of the coils 120 and 125 and the connections between the coils.

Figure 4A:
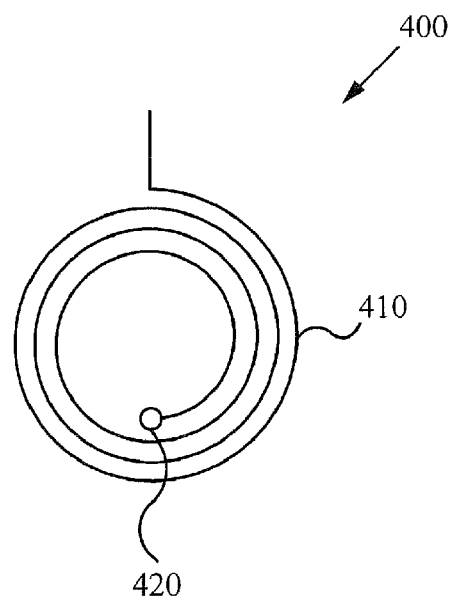
FIG. 4A illustrates an alternative circular coil geometry.
Figure 4B:
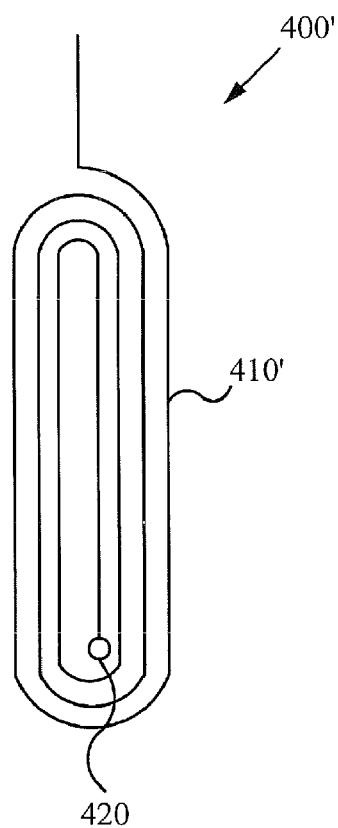
FIG. 4B illustrates an alternative elliptical coil geometry.

FIGS. 4A and 4B depict alternative embodiments of the coils. In FIG. 4A, the coil is circular. The coil conductor 410 is shown spiraling inwards but can also be a coil that spirals outward. The coil ends at a coupling point 420 which can be but is not limited to a plated through hole 420. The coil can be formed of any conductor or semiconductor, preferably copper.

In FIG. 4B, the coil is an elliptical or race track shape providing a shaped response pattern to electrical and magnetic fields. The conductor 410' of a coil is shown spiraling inwards but can also be a coil 410 that spirals outward. The coils end at a coupling point 420 which can be but is not limited to a plated through hole 420. The coil can be formed of any conductor or semiconductor, preferably copper. The coil shapes can be changed for packaging reasons or for shaping a response or transmission pattern of the multi-turn coil.

Figure 5:
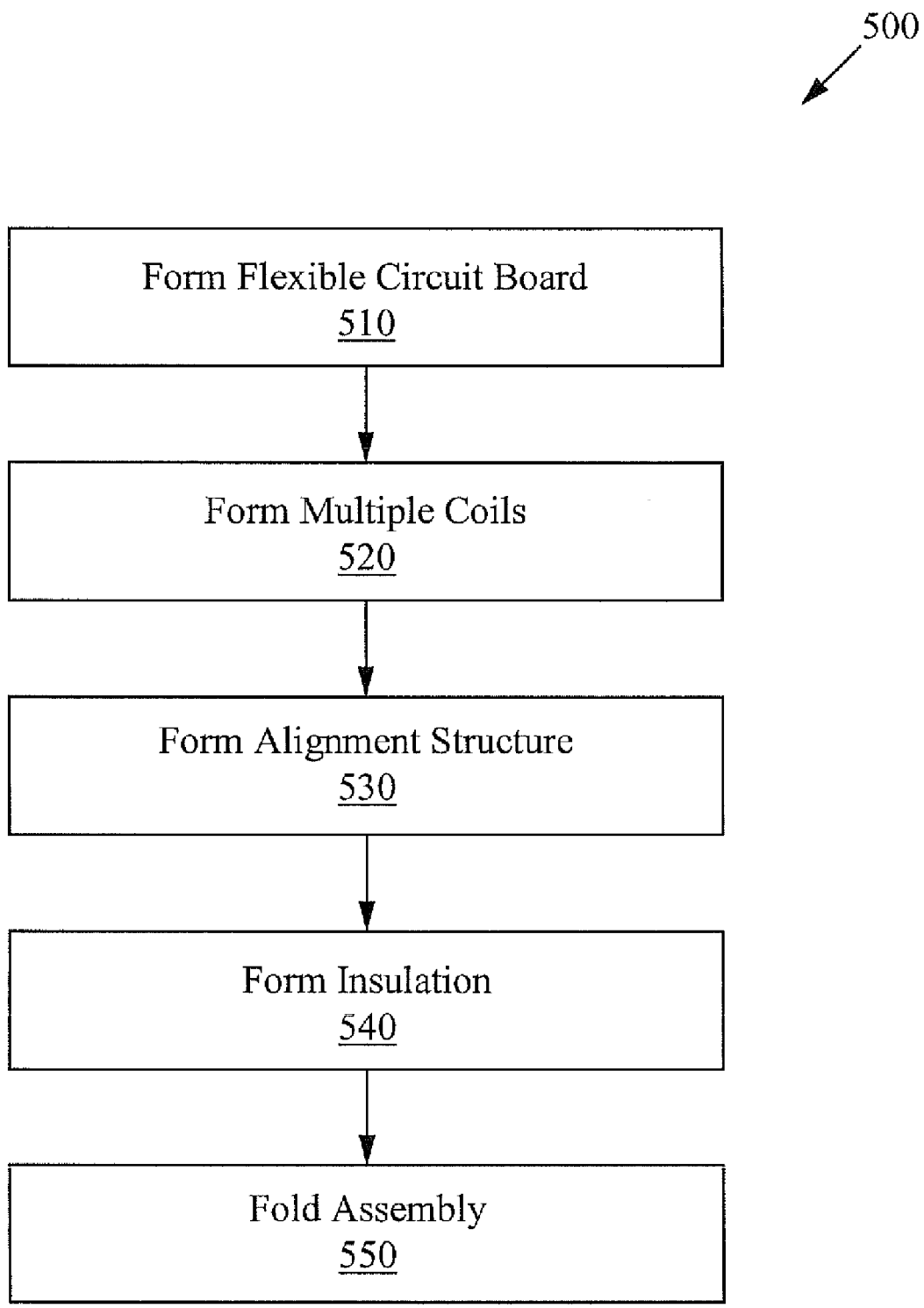
FIG. 5 illustrates a flow chart of the inventive steps for forming a multi-turn coil.

FIG. 5 shows a block diagram of the inventive steps of manufacturing a multi-turn coil 500. The method begins at the formation of a flexible circuit board 510. The board can be formed of any commonly used material for forming flexible circuit boards including but not limited to polymers. The flexible circuit board can be a multi-layer board with circuit traces formed to support functions other than the multi-turn coil. Where through holes are used to electrically couple coils, the required through holes can be formed in this step.

In the step 520, the coils are formed and coupled to the flexible circuit board formed in step 510. Preferably the coils are formed by plating a copper base on the flexible circuit board and etching the traces. However, other techniques are contemplated including but not limited to attaching preformed coils to the flexible circuit board or printing the coils with electrically conductive ink. The coils can be formed and coupled on a single side, both sides or can be contained within the layers of the flexible circuit board. The formation of the coils can also form the electrical connections through the flexible circuit board (the plated through holes) and the connections between the coils. Further, if an electrical conductor or trace transverses another conductor, the step includes the formation of an insulation barrier to prevent shorting between the conductors.

In the optional step 530, an alignment structure is formed. The alignment structure assists in the alignment of the coupled coils such that the coils are substantially overlapping and the all have the same circuit flow direction. The alignment structure is preferably a folding line that is formed by scoring the flexible circuit board while not damaging the traces that transect the fold line. Other methods of forming a folding line are contemplated. These include but are not limited to perforations, or cuts in the flexible circuit board. Other alignment structures are contemplated including but not limited to alignment holes, indentations, and alignment markings for external machines or operators to use for alignment.

In the step 540, insulation is coupled to at least the coils that will come into contact with other coils or electrical traces when folded. Preferably, the coating is a membrane that is glued to the coils before the flexible board is folded. Alternatively, the membrane can be held in place by pressure of the folded circuit board. The insulating membrane can be individual pieces for each coil needing insulation, a single membrane for each side, or a single membrane that substantially wraps the entire flexible circuit board with the coupled coils. Apertures can be formed in the membrane for the contact points on the multi-turn coil. Also, within the contemplation of the invention, is the application of an insulation coating to both sides of the board. The method of applying the insulation includes but is not limited to spraying or dipping the multi-turn assembly into an insulation material. The insulation material may require drying or curing after application. Preferably the insulation material is flexible and does not impede the folding of the flexible circuit board and coils.

In the step 550, the flexible circuit board with the coupled coils is folded to form a multi-turn coil. Preferable, an accordion fold is used but other folding patterns are contemplated. These patterns include but are not limited to a fold over pattern, a double fold, and a roll fold. The fold over pattern has the circuit board folded in-half, and again in half. The double fold patterns has the ends folded towards the middle and then this structure is folded in-half. For a roll fold, a coil on one end is folded over onto the adjacent coil. These fold patterns are repeated until all the coils are substantially aligned and thereby forming a multi-turn coil.

Other folding patterns are contemplated. Additionally geometries other than a linear coil are contemplated. Folding patterns could be used to create a toroid-shaped coil.

What is claimed is:

1. A multi-turn coil device comprising:
   a. a flexible circuit board having a first side, and a second side on the opposite side of the flexible circuit board as the first side when the flexible circuit board; is unfolded
   b. a plurality of serially electrically coupled coils coupled to the flexible circuit board, each coil having a coil direction, and wherein the coils are positioned such that each coil substantially overlaps each of the other coils when the flexible circuit board is folded; and
   c. one or more conductive paths formed from the first side to the second side of the flexible circuit board, wherein one or more coils of the plurality of serially electrically coupled coils are coupled to the second side, and wherein at least one coil of the plurality of serially electrically coupled coils on the first side is electrically coupled to an opposing coil of the plurality of serially electrically coupled coils on the second side through the one or more conductive paths when the flexible circuit board is unfolded.

2. The device of claim 1, wherein the plurality of serially electrically coupled coils is formed such that, when the flexible circuit board is folded, the coil direction of the plurality of serially electrically coupled coils is substantially the same.

3. The device of claim 1, wherein the flexible circuit board is a multilayer flexible circuit board.

4. The device of claim 1, further comprising an insulator configured to prevent the shorting of the plurality of serially electrically coupled coils when the flexible circuit board is folded.

5. The device of claim 4, wherein the insulator is an insulating membrane coupled to the first side and the second side.

6. The device of claim 4, wherein the insulator includes individual membranes coupled to the plurality of serially electrically coupled coils.

7. The device of claim 4, further comprising coupling material between the plurality of serially electrically coupled coils and the insulator to hold the device in a folded aligned configuration.

8. The device of claim 1, further comprising one or more alignment means.

9. The device of claim 8, wherein the alignment means is a folding line.

10. The device of claim 1, wherein the flexible circuit board if folded a pattern formed in the flexible circuit board, therein forming a multi-turn coil.

11. The device of claim 10, wherein the pattern is an accordion folding pattern, a fold over pattern, a double fold pattern, or a rolling fold pattern.

12. The device of claim 1, wherein the one or more conductive paths are plated through holes.

* * * * *

UNITED STATES PATENT AND TRADEMARK OFFICE
CERTIFICATE OF CORRECTION

PATENT NO. : 8,387,234 B2
APPLICATION NO. : 12/940701
DATED : March 5, 2013
INVENTOR(S) : Bruce D. Olson It is certified that error appears in the above-identified patent and that said Letters Patent is hereby corrected as shown below:

IN THE CLAIMS

At column 8, line 8, Claim 1, please replace "board; is unfolded" with -- board is unfolded; -- so that the corresponding phrase reads -- flexible circuit board is unfolded; --.

Signed and Sealed this
Seventh Day of May, 2013

Teresa Stanek Rea
*Acting Director of the United States Patent and Trademark Office*